United States Patent
Yoneda et al.

(10) Patent No.: US 7,638,782 B2
(45) Date of Patent: Dec. 29, 2009

(54) SEMICONDUCTOR DEVICE MANUFACTURING METHOD AND ION IMPLANTER USED THEREIN

(75) Inventors: Kenji Yoneda, Kyoto (JP); Masahiko Niwayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 587 days.

(21) Appl. No.: 11/204,050

(22) Filed: Aug. 16, 2005

(65) Prior Publication Data

US 2006/0163498 A1 Jul. 27, 2006

(30) Foreign Application Priority Data

Jan. 25, 2005 (JP) ............................ 2005-017327

(51) Int. Cl.
*G01K 1/08* (2006.01)
*H01J 3/14* (2006.01)
*H01J 3/26* (2006.01)

(52) U.S. Cl. ................. 250/492.21; 250/397; 250/398; 315/111.81; 438/510; 438/513

(58) Field of Classification Search ............ 250/492.21, 250/397, 398
See application file for complete search history.

(56) References Cited

U.S. PATENT DOCUMENTS 7,038,223 B2 * 5/2006 Starcher ................ 250/492.21
7,118,657 B2 * 10/2006 Golovchenko et al. ... 204/192.3

FOREIGN PATENT DOCUMENTS

| JP | 07-221306 | 8/1995 |
| JP | 11-307039 | 11/1999 |
| JP | 3202002 | 6/2001 |

OTHER PUBLICATIONS

Kubo, Hiroko., et al. "Quantitative Charge Build-Up Evaluation Technique by Using MOS Capacitors with Charge Collecting Electrodes in Wafer Processing." IEICE Transactions on Electronics, vol. E79-C, No. 2, Feb. 1996 pp. 198-205.
Aoki, Norishige, "Charging Damage in Semiconductor Process." Chapter 3, Realize Corporation, Feb. 29, 2005, pp. 187-194 (w/4 Pages of Partial English translation).

* cited by examiner

*Primary Examiner*—David A Vanore
(74) *Attorney, Agent, or Firm*—McDermott Will & Emery LLP (57) ABSTRACT

Impurity ions are implanted into a semiconductor wafer of which a capacitor insulting film is formed on a principal face. In this impurity ion implantation step, the impurity ions are implanted into the semiconductor wafer in the form of a pulsed beam that repeats ON-OFF operation intermittently.

14 Claims, 7 Drawing Sheets

SEMICONDUCTOR DEVICE MANUFACTURING METHOD AND ION IMPLANTER USED THEREIN

CROSS REFERENCE TO RELATED APPLICATIONS

This Non-provisional application claims priority under 35 U.S.C. § 119(a) on Patent Application No. 2005-17327 filed in Japan on Jan. 25, 2005, the entire contents of which are hereby incorporated by reference.

BACKGROUND ART

The present invention relates to a semiconductor device manufacturing method and an ion implanter used therein, and more particularly relates to method for manufacturing a semiconductor device that includes a capacitor insulating film to which ion implantation is performed.

Recently, gate insulating films become thinner in association with miniaturization of elements in semiconductor devices, and therefore, liabilities for damage and dielectric breakdown of the gate insulating films by charge-up in process increase. Among of all, charge-up caused by plasma etching, plasma CVD, and ion implantation presents significant problems in process.

Referring to the ion implantation, an ion beam electrified positively is implanted directly into a semiconductor element or a semiconductor substrate, so that the surface portion of the semiconductor element is liable to be electrified positively. Particularly, if the gate insulating film is very thin, dielectric breakdown is liable to be caused in the gate insulating film by the positive charge-up. Further, if the area of an electrode portion called antenna for collecting charge is large, the surface potential of the semiconductor element is liable to rise for much charge are collected. When the collected charge exceeds a given amount and further exceeds the amount of charge to breakdown $Q_{bd}$ inherent to the gate insulating film, dielectric breakdown is caused (for example, see "Quantitative Charge Build-Up Evaluation Technique by Using MOS Capacitors with Charge Collecting Electrode in Wafer Processing," by Hiroko Kubo et al., IEICE Transactions on Electronics, Vol. E79-C No. 2, pp. 198-205, February, 1996).

The dielectric breakdown by an ion beam is more liable to be caused as the beam current density is higher. Also, it is known that breakdown by charge-up is more liable to be caused as acceleration energy for ions at ion implantation is higher. Under the circumstances, a method of preventing the dielectric breakdown has been proposed in which conditions for ion implantation are set so that an acceleration energy and a beam current become equal to or lower than an amount of charge to breakdown $Q_{bd}$ of a gate insulating film in order not to cause the breakdown by charge-up (for example, see Japanese Patent Application Laid Open Publication No. 7-221306A, which is referred hereinafter to as Patent Document 1).

Further, there are known methods using various electron flood guns for supplying electrons for neutralizing positive charge onto a semiconductor element in order to prevent the positive charge-up by ion beams. However, it is further known that the electron flood guns supply negative charge to the surface of the semiconductor element, similar to the ion beams, to cause negative electrification of the surface portion to the contrary, inviting dielectric breakdown by the negative charge-up. Under the circumstances, a technique has been reported in which the negative charge-up by electrons from an electron flood gun in the surface portion of a semiconductor element is suppressed so that the charge-up amount is controlled at a value equal to or smaller than the breakdown voltage by controlling the energy of the electrons from the electron flood gun (for example, see Japanese Patent Publication No. 3202002B, which is referred hereinafter to as Patent Document 2).

Though the dielectric breakdown of the gate insulating films can be obviated by suppressing the negative charge-up by the electron flood gun, it is still awkward to say that the other dielectric breakdown of the gate insulating films, which is caused due to the positive charge-up by the ion beams, is prevented completely. The positive charge-up depends on an electron neutralization mechanism by the electron flood gun relative to the ion beam used for ion implantation, and the charge-up neutralization depends on not only the beam current, the acceleration energy, and the like but also beam scanning speed and the like.

The present inventors have found that the charge-up state caused due to ion beams rather differs depending on the beam scanning speed. The beam scan methods includes various methods such as: a method in which an ion beam scans two-dimensionally on the X-Y plane electrostatically or electromagnetically with a substrate fixed; a method in which the ion beam scans the substrate one-dimensionally and electrostatically or electromagnetically while a semiconductor substrate is scanned mechanically and one-dimensionally in a direction perpendicular to the scanning direction of an ion beam; a method in which radial direction (r) to rotation direction (θ) scan is performed to a wafer placed and rotated on a rotary disk one-dimensionally in the radial direction of the disk with an ion beam fixed; a method in which a semiconductor wafer is scanned in the X-Y direction mechanically with an ion beam fixed; and so on. Wherein, the relative line velocity of the ion beam and the semiconductor wafer differs largely among the methods. In this way, the scanning speed ranges wide from extremely low-speed scan to extremely high-speed scan, and therefore, a scheme for suppressing the positive charge-up with no dependency on the scanning speed and the scan method is demanded.

SUMMARY OF THE INVENTION

The present inventors have found that the positive charge-up by the ion beam in ion implantation produces critical damage on the semiconductor devices such as degradation or dielectric breakdown of the gate insulating films, degradation or junction breakdown of PN junctions, and the like.

As described above, a flood gun supplies negative electrons for neutralizing the positive charge-up by the ion beam in general. Nevertheless, the electron flood gun, which causes the negative charge-up, produces damage on the semiconductor devices according to the conditions. In this connection, Patent Document 2 discloses that when an electron flood gun that can control the energy of electrons at 2d [eV] or lower is used wherein d is the thickness [nm] of a gate insulating film, damage by the electron flood gun can be mitigated. Hence, the use of the electron flood gun disclosed in Patent Document 2 can prevent at least excessive negative charge-up by the electron flood gun regardless of the device construction.

Referring to the positive charge-up, however, the ion beam for ion implantation invites the charge-up while the energy of the positive ion beam must be set to a value determined in process design. Thus, the energy cannot be determined necessarily, different from the case of the energy of negative electrons from the electron flood gun. In general, the energy of the positive ion beam is set within the range from 100 eV to several hundreds eV or several MeV in some times according to process design. Also, a current of the positive ion beam is set within the range from several hundreds μA to several tens mA according to its dose amount. Accordingly, the charge-up by the positive ion beam depends largely on the beam current density and the acceleration energy of the beam. These subjects are disclosed in Patent Document 1 also.

Figure 8A:
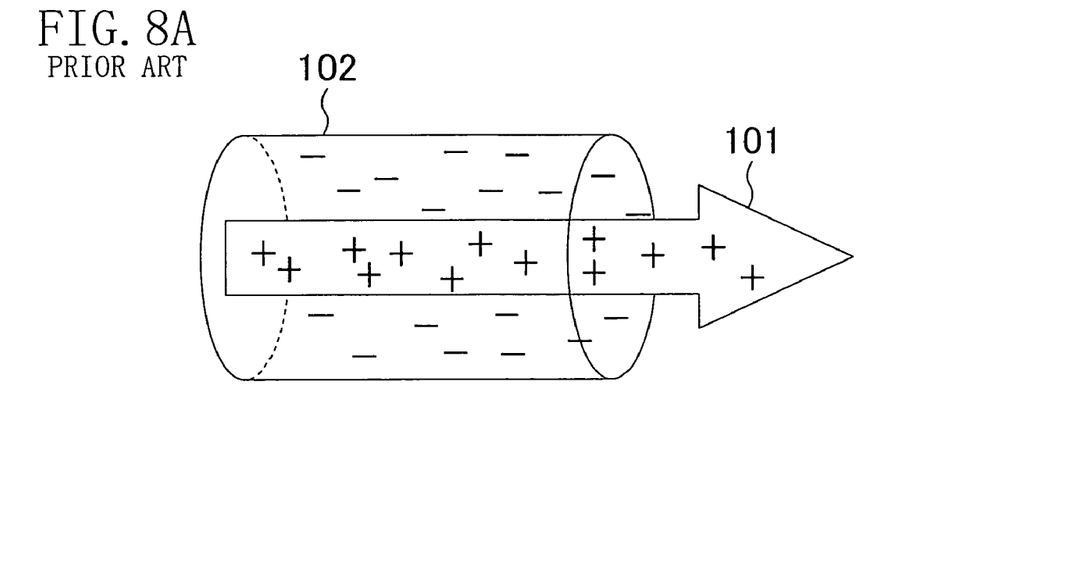
FIG. 8A is a schematic view showing the positional relationship between an ion beam and electrons from an electron flood gun.

Until now, it has been thought in general that the positive ion beam is neutralized by the electrons by irradiating the negative electrons from an electron flood gun to the positive ion beam current. While, there is a report that the electrons 102 emitted from an electron flood gun surrounds the positive ion beam 101, as shown in FIG. 8A, rather than that the positive ion beam is neutralized by the negative electrons (for example, see "Charging Damage in Semiconductor Process," Chapter 3, published by Realize Corporation, pp. 187-194, Feb. 29, 1996).

Figure 8B:
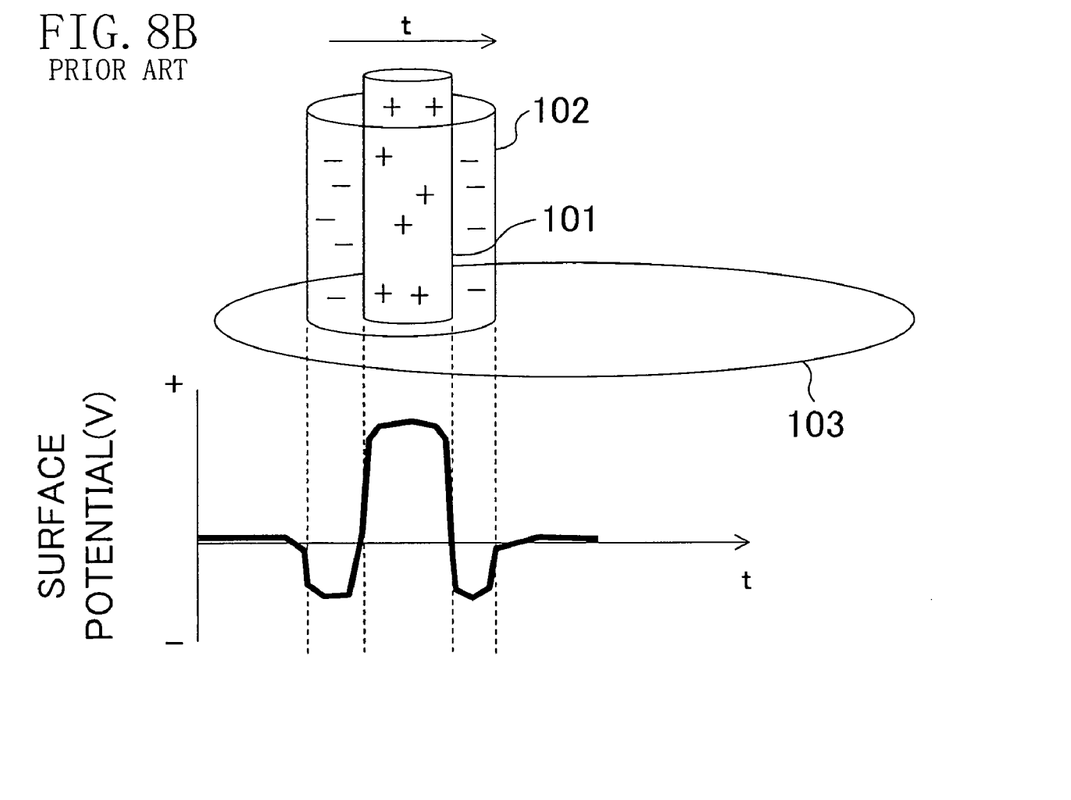
FIG. 8B is a schematic view showing potential at the surface of a semiconductor wafer when the ion beam and the electrons from the flood gun which surround the ion beam scan the surface of the semiconductor wafer.

Specifically, as shown in FIG. 8B, when a positive ion beam 101 passes over the surface of a semiconductor wafer 103, the surface portion of the semiconductor wafer 103 is charged up negatively by forward electrons 102 surrounding the positive ion beam 101 first, is charged positively by the positive ion beam 101, and then, is charged up negatively again by rearward electrons 102 surrounding the positive ion beam 101. In this way, the phenomenon that the positive charge-up is neutralized by the electron flood gun is a mere phenomenon that the surface potential once raised by the positive ion beam 101 is lowered thereafter by the negative electrons from the electron flood gun. In other words, it is apparent neutralization in which the surface potential being positively charged up returns to the original potential by the negative electrons from the electron flood gun, instead of that the surface potential is neutralized at the same time when the ion beam is irradiated onto the surface of the wafer.

Figure 9A:
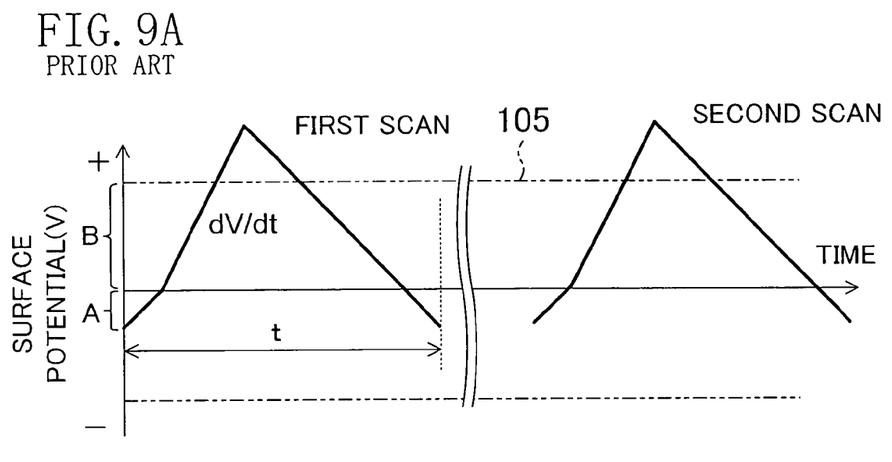
FIG. 9A is a graph showing the relationship in a conventional example between potential change at the surface of a semiconductor wafer and maximum breakdown voltage in the case where the semiconductor wafer is scanned using an ion beam and electrons from an electron flood gun which surround the ion beam in FIG. 8B.

As shown in the surface potential graph of FIG. 9A, the surface potential rises once from a negative potential A resulted from the emission of the electrons to a positive potential B by the positive ion beam. The rising rate dV/dt of the potential at this time is determined depending on the energy and the current density of the ion beam. Also, a finally-reaching potential depends on time required for the ion beam to pass through one point on the semiconductor wafer. Accordingly, the potential rises by continuous irradiation of the ion beam at one point, and then, shall exceed a dielectric breakdown voltage 105 of the gate insulating film.

When the potential exceeds the dielectric breakdown voltage 105 of the gate insulating film, a tunnel current starts to flow to the gate insulating film. This allows the current to flow to the gate insulating film excessively, though the rise in the surface potential is moderated, to cause the dielectric breakdown. Therefore, it is necessary to neutralize the positive charge-up by the electrons from the electron flood gun by moving the beam all time through scanning operation with respect to one point of the semiconductor wafer until the surface potential reaches the breakdown voltage through the positive charge-up. The breakdown by the positive charge-up occurs remarkably in the case where the scanning speed of the ion beam, that is, the relative speed of the ion beam and one point on the semiconductor wafer is smaller than a predetermined value.

In sum, it takes time for the ion beam to pass over the semiconductor wafer when the relative speed of the ion beam and the semiconductor wafer is small. In this connection, the surface potential of the semiconductor wafer continues to rise according to the current density of the beam during passing of the ion beam, which in turn causes dielectric breakdown or damage on the gate insulating film.

In this way, the electrons from the electron flood gun are irradiated only after the gate insulating film is damaged or broken by the positive charge-up, resulting in unreliable neutralization of the positive charge-up by the electron flood gun.

Figure 9B:
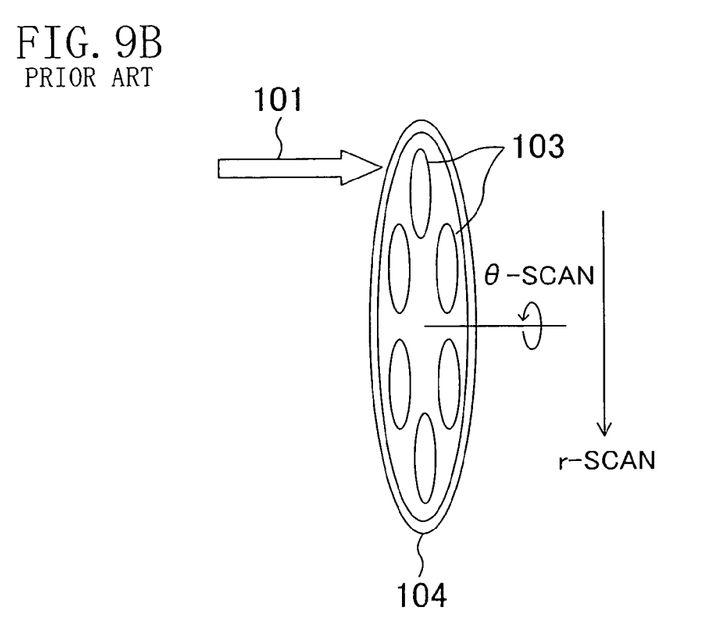
FIG. 9B is a schematic perspective view illustrating one example of a ion beam scanning method according to the conventional example.

FIG. 9B schematically shows a generally-called r-θ scan method in which a rotary disk 104 is scanned in the Y direction (a perpendicular direction) with a plurality of semiconductor wafers 103 placed and rotated on the rotary disk 104 and the ion beam fixed. Though the positive charge-up would be probably mitigated by increasing the relative scanning speed of the ion beam 101 and the semiconductor wafer 103, the scanning speed of the ion beam 101 cannot be set arbitrarily because the scanning speed is influenced also by the scanning mechanism of an ion implanter and the process conditions. Under the circumstances, it is desired to suppress the positive charge-up on the output side of the ion beam 101 regardless of the beam scanning mechanism.

The present invention has its object of preventing dielectric breakdown and damages on an insulating film by solving the above conventional problems and suppressing the positive charge-up in a semiconductor device formed on a semiconductor substrate in any scan methods and at any scanning speeds of an ion beam.

To attain the above object, the present invention provides a semiconductor device manufacturing method in which a pulsed ion beam is irradiated in ion bean implantation into a part of a semiconductor wafer (semiconductor substrate) or a semiconductor region.

Specifically, a semiconductor device manufacturing method according to the present invention includes the steps of: (a) forming an insulating film on a semiconductor region; and (b) implanting an impurity ion into the semiconductor region on which the insulating film is formed, wherein in the step (b), the impurity ion is implanted into the semiconductor region in a form of a pulsed ion beam for intermittent irradiation.

In the semiconductor device manufacturing method of the present invention, the pulse width of the pulsed ion beam is adjusted, so that the irradiation time during which the ion beam is irradiated onto the surface of the semiconductor region can be controlled independently. Accordingly, the positive charge-up can be suppressed in any scan methods and at any scanning speeds of the beam. In turn, the positive charge-up can be neutralized reliably by, for example, an electron flood gun, preventing dielectric breakdown and damage on the insulating film in the case where the insulating film is a capacitor insulating film.

In the semiconductor device manufacturing method according to the present invention, the insulating film is preferably a capacitor insulating film. Further, the insulating film is preferably a gate insulating film. This prevents damage on the insulating film thinned in association with miniaturization of semiconductor elements.

In the semiconductor device manufacturing method according to the present invention, it is preferable that in the step (b), the ion beam is implanted so that a pulse width t [s] of the intermittent pulsed beam fulfills: t [s]≦(a capacitance per unit area of the insulating film×2d×$10^7$)/(an average current density of the ion beam), wherein d [cm] is a film thickness of the insulating film.

In the semiconductor device manufacturing method according to the present invention, it is preferable that the semiconductor region is a semiconductor substrate or a semiconductor layer formed on a semiconductor substrate and in the step (b), the semiconductor substrate is two-dimensionally scanned within a substrate plane thereof or is scanned while rotating within the plane thereof with the ion beam fixed.

In the semiconductor device manufacturing method according to the present invention, it is preferable that the semiconductor region is a semiconductor substrate or a semiconductor layer formed on a semiconductor substrate and in the step (b), the ion beam scans the semiconductor substrate in a first direction electrostatically or electromagnetically within a substrate surface thereof while the semiconductor substrate is scanned in a second direction intersecting with the first direction within the substrate surface thereof.

In the semiconductor device manufacturing method according to the present invention, it is preferable that the semiconductor region is a semiconductor substrate or a semiconductor layer formed on a semiconductor substrate and in the step (b), the ion beam scans the semiconductor substrate two-dimensionally and electrostatically or electromagnetically within a substrate surface thereof.

In the semiconductor device manufacturing method according to the present invention, it is preferable that the step (b) includes a step of supplying, from an electron flood gun onto the semiconductor region, electrons for preventing the semiconductor region from being positively electrified by implantation of the ion beam and an energy E [eV] of the electrons from the electron flood gun is equal to or smaller than $2d \times 10^7 (E \leq 2d \times 10^7)$.

In the semiconductor device manufacturing method according to the present invention, a duty ratio of a pulse of the pulsed ion beam is preferably higher than 0 and equal to or lower than 50%.

A first ion implanter according to the present invention, includes: an ion beam generator that outputs an ion beam continuously; a mass spectrometer that discriminates a predetermined ion species, according to a mass thereof, from the output ion beam; and a beam shield which is arranged on a line where the output ion beam passes and which generates an intermittent pulsed ion beam from the continuously-output ion beam.

In the first ion implanter, the ion beam is irradiated intermittently onto the surface of a to-be-irradiated substance. This suppresses rise in surface potential of the to-be-irradiated substance, enabling reliable neutralization of the positive charge-up by an electron flood gun. As a result, in the case where a capacitor insulating film is formed in the to-be-irradiated substance, dielectric breakdown and damage on the capacitor insulating film can be prevented.

In the first ion implanter, it is preferable that the beam shield includes a plate member and a rotary mechanism that allows the plate member to rotate with an normal line of a plate plane as an rotation axis and a plurality of first openings each of which allows the ion beam to pass therethrough are formed through the plate member at regular intervals along a circle having the rotation axis as a center.

In this case, it is preferable to form a plurality of second openings through the plate member at regular intervals along another circle having the rotation axis as a center in a region inside or outside the plurality of first openings.

In the first ion implanter, it is preferable that the beam shied includes a disk member and a rotary mechanism that allows the disk member to rotate with a normal line of a disk plane of the disk as a center and a plurality of blades that shied the ion beam are provided at regular intervals in a peripheral portion of the disk member.

In the first ion implanter, it is preferable that the beam shield includes a plate member and a one-dimensional drive mechanism that allows the plate member to be in reciprocating motion in a direction parallel to a plate plane of the plate member and a plurality of openings each of which allows the ion beam to pass therethrough are formed through the plate member at regular intervals.

In the first ion implanter, it is preferable to arrange the beam shield between the mass spectrometer and a target (substance to be irradiated) into which the ion beam is to be implanted.

In the first ion implanter, it is preferable that the ion beam generator includes an ion beam extraction section that outputs an ion beam from an ion source and the beam shield is arranged between the ion beam extraction section and the mass spectrometer.

A second ion implanter according to the present invention includes: an ion beam generator; and a mass spectrometer that discriminates a predetermined ion species, according to a mass thereof, from an ion beam output from the ion beam generator, wherein the ion beam generator includes: an ion beam extraction section that outputs an ion beam from an ion source; and a pulse generation section that outputs a pulsed ion beam by applying pulsed acceleration voltage to the ion beam extraction section.

In the second ion implanter, the ion beam is irradiated intermittently onto the surface of a to-be-irradiated substance. This suppresses rise in surface potential of the to-be-irradiated substance, enabling reliable neutralization of the positive charge-up by an electron flood gun. As a result, in the case where a capacitor insulating film is formed in the to-be-irradiated substance, dielectric breakdown and damage on the capacitor insulating film can be prevented.

DESCRIPTION OF THE PREFERRED EMBODIMENTS

Embodiment 1

Embodiment 1 of the present invention will be described below with reference to the drawings.

Figure 1A:
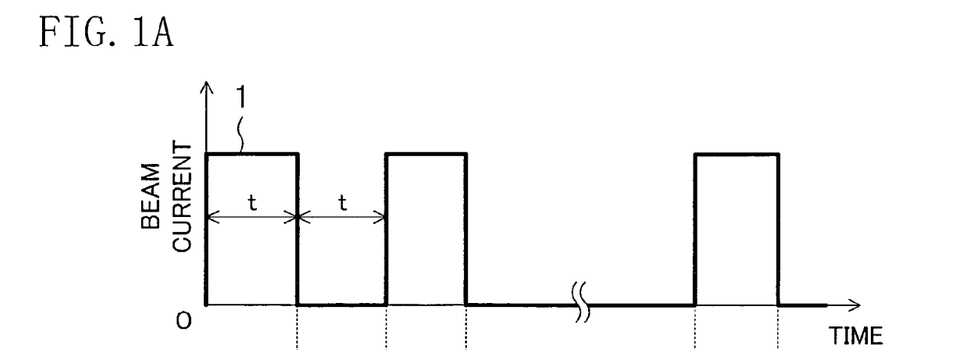
FIG. 1A is a graph showing current-time dependency of a pulsed ion beam in a semiconductor device manufacturing method according to Embodiment 1 of the present invention.
Figure 1B:
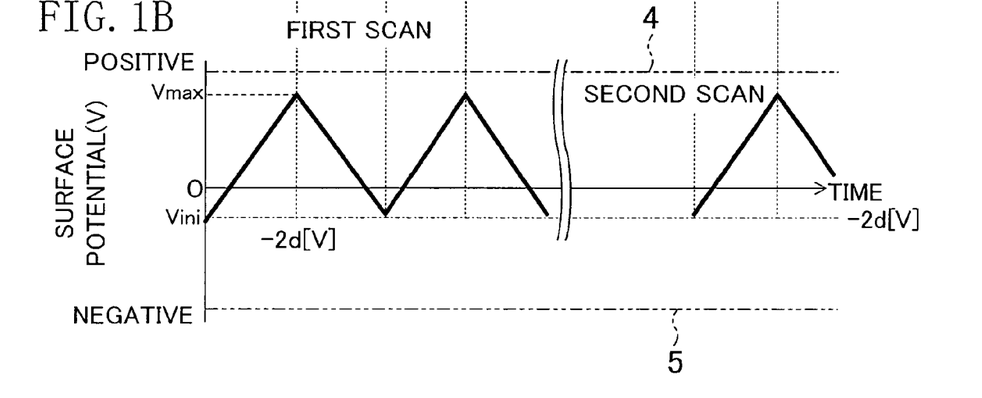
FIG. 1B is a graph showing potential change at the surface of a semiconductor element formed on a semiconductor wafer in the case employing the semiconductor device manufacturing method according to Embodiment 1 of the present invention.

FIG. 1A shows current-time dependency of a pulsed ion beam used in a semiconductor device manufacturing method according to Embodiment 1 of the present invention, and FIG. 1B shows potential change at the surface of a semiconductor element formed on a semiconductor wafer in a case employing an ion implantation method in the semiconductor device manufacturing method according to Embodiment 1 of the present invention. The surface potential of a gate electrode in a MOS transistor including a gate insulating film having a thickness of 2.0 nm and made of silicon oxide ($SiO_2$) is indicated as the semiconductor element herein.

In irradiation of an intermittent ion beam 1 having a pulse width t as shown in FIG. 1A to the MOS transistor, the surface potential Vini of the gate electrode is negatively charged up once by electrons (not shown) output from an electron flood gun and surrounding the ion beam 1. Wherein, the energy of the electrons supplied from the electron flood gun is limited to be equal to or lower than 2d [eV] relative to the film thickness d [nm] of the gate insulating film, so that the energy will not be 2d [eV] or higher to the maximum. Hence, dielectric breakdown is not caused by the electron flood gun. For example, the maximum negative voltage is −4 V when the film thickness of the gate insulating film is 2.0 nm. Next, the surface potential changes from negative to positive by the positive ion beam 1. The potential change rate dV/dt at that time is determined depending on a current density J [$A/cm^2$] of the ion beam 1 and a capacitance C [F] per unit area of the gate insulating film. Simply, rising speed per unit time of the surface potential increases as the current density J of the beam becomes higher.

On the other hand, the surface potential increases positively as the time period for irradiation of the ion beam 1 is increased. This is expressed by V=Jt/C from the relationship of Q=CV and Q=Jt. Accordingly, the surface potential rises more largely as the irradiation time period t [s] becomes longer. Thus, by shortening the time period for beam irradiation, the positive rise of the potential can be restricted so that the potential does not reach a breakdown voltage 4 of the gate insulating film. Wherein, on the assumption that t=∞ (a state where the beam is stationary), the potential of the gate electrode continues to rise by the positive ion beam 1 to cause a higher tunneling current to start to flow to the gate insulating film by voltage over the breakdown voltage 4, resulting in saturation in the end. Much positive charge passes through the gate insulating film until then to break the gate insulating film.

While in Embodiment 1, the time period for ion beam irradiation is limited according to the pulse width t [s] of the ion beam 1, as shown in FIG. 1A, so that the positive surface potential cannot rise over a given value even if beam scan is performed by any manner or even if the beam is stationary. Specifically, as described above, the electrons from the electron flood gun exist around the positive ion beam 1 so as to surround the ion beam 1. Accordingly, when scan by the ion beam 1 is performed, the electrons change from negative (flood gun) to positive (beam), and then, to negative (flood gun) sequentially in this order, thereby neutralizing the positive charge-up by the ion beam 1.

Further, even if the ion beam is stationary without scan performed, a part where the beam has existed through output of the pulsed ion beam 1 until then is filled with the electrons from the electron flood gun at the moment when the output pulsed ion beam 1 interrupts. For this reason, during the time when the pulsed ion beam 1 is not irradiated, the surface of the semiconductor element becomes at a negative potential, whereby the positive voltage by the positive ion beam 1 irradiated until then is neutralized. Thus, the irradiation of the pulsed ion beam 1 suppresses the positive charge-up caused in the semiconductor element regardless of the scanning speed of the ion beam 1.

Referring to the pulsed ion beam 1, the pulse width that enables control of the positive charge-up can be calculated as follow.

Suppose that the film thickness of the gate insulating film is d [nm], the pulse width is t [s], and the beam current density is J [$A/cm^2$]. The energy of electrons which brings no dielectric breakdown of the gate insulating film is 2d [eV] to the maximum, as referred to in Patent Document 2, and accordingly, the maximum potential that brings no dielectric breakdown is equal to 2d [V]. When using 2d [V] as an index, the maximum voltage is calculated to be 4 V in an absolute value in the gate insulating film having a thickness of 2 nm. On the other hand, when Q=Jt and V=2d from the relational expression of Q=CV are substituted into t≦Q/J, Equation (1) is held.

$$t \leq \{(\text{capacitance per unit area of gate insulating film} = C) \times 2d\}/J \quad (1)$$

Further, Equation (2) is obtained from $C = \epsilon\epsilon_0/(d \times 10^{-7})$.

$$t \leq (2\epsilon\epsilon_0 \times 10^7)/J \quad (2)$$

Wherein, $\epsilon$ is a relative dielectric constant of the gate insulating film and $\epsilon_0$ is an electric constant.

As can be understood from Equation (2), the time period for beam irradiation that brings no breakdown by positive charge-up is a mere function of the beam current density J regardless of the film thickness d of the gate insulating film. For example, when the beam current density J is estimated to be 3 $mA/cm^2$, the maximum time period t for irradiation of the ion beam 1 can be calculated to be equal to or smaller than 2.3 ms (t≦2.3 ms). Accordingly, in the case where the beam current density is 3 $mA/cm^2$, no dielectric breakdown is caused under any beam scan conditions only if the pulse width is set to 2.3 ms or smaller.

In Embodiment 1, the duty ratio of the pulsed ion beam 1 is set to 50%. With the 50% duty ratio of the pulse set, time required for implantation can be restricted to be twice to the maximum, compared with the case where the ion beam 1 is implanted continuously rather than intermittently. It is noted that the duty ratio can be set in a range between higher than 0% and equal to or lower than 50%, wherein a duty ratio that brings the throughput to be the maximum is 50%. The duty ratio set higher than 50% might cause insufficient neutralization of the positive charge-up by the electrons from the electron flood gun.

The validity of the pulse width is verified using an ion implanter of a currently-available semiconductor substrate scan type. Herein, the time period for beam irradiation is calculated under the conditions that a butch ion implanter having a disk of 900 mm in diameter is used and the beam current density is 3 mA/cm$^2$. In general, the number of rotation of a disk is in the range between about 100 rpm and about 1200 rpm. The time period for irradiating the ion beam 1 at one point on the semiconductor substrate is calculated on the assumption that the number of rotation is set to the lowest value, 100 rpm.

If the beam diameter is about 20 mm, a relative linear velocity per second of the ion beam 1 and the semiconductor substrate is 4.71 m/s. At that time, time required for the beam having a diameter of 20 mm to pass over one point on the semiconductor substrate is 4.2 ms, which is about twice the pulse width. Taking the current distribution of the ion beam 1 into consideration, an effective beam diameter is considered to be smaller than 20 mm on the assumption that the beam current is in Gaussian distribution. Accordingly, the time for the ion beam 1 to pass thereover becomes shorter than 4.2 ms. Anyway, scan at a relative linear velocity higher than 42. ms further lowers the possibility of the positive charge-up.

In Embodiment 1 using the pulsed ion beam 1 for ion implantation, the positive charge-up can be, of cause, suppressed regardless of the beam scanning speed.

Figure 1C:
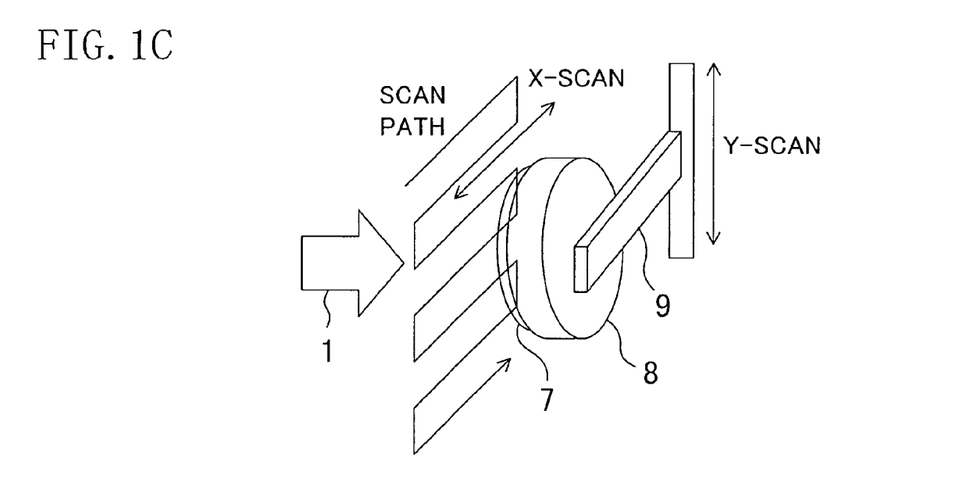
FIG. 1C is a schematic perspective view illustrating a scan method for scanning the semiconductor wafer by an intermittent ion beam in the semiconductor device manufacturing method according to Embodiment 1 of the present invention.

For example, as shown in FIG. 1C, beam scan was performed in such a manner that an arm 9 was scanned in the Y direction at 10 mm/s while a platen 8 to which a semiconductor wafer 7 was fixed was scanned by the arm 9 in the X direction at a frequency of 2 Hz with the ion beam 1 fixed. The relative linear velocity of the semiconductor wafer 7 and the ion beam 1 was set to 0.8 m/s. If the diameter of the ion beam 1 was 20 mm, the time during which the ion beam 1 is irradiated at one point on the semiconductor wafer 7 was 25 ms. It is confirmed that no dielectric breakdown of the gate insulating film is caused by the positive charge-up even in such beam irradiation.

It is noted that the relative linear velocity of the ion beam 1 and the semiconductor wafer 7 is preferably 7 m/s or lower.

Embodiment 2

Embodiment 2 of the present invention will be described below with reference to the drawings.

Figure 2A:
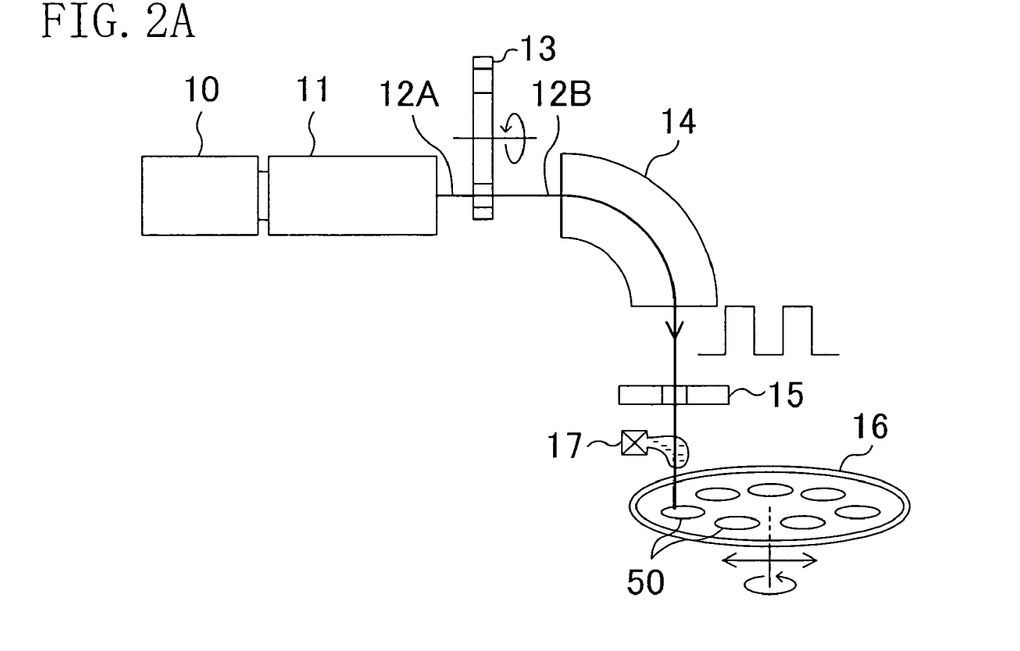
FIG. 2A is a schematic view showing the main part of an ion implanter according to Embodiment 2 of the present invention.

FIG. 2A schematically shows the main part of an ion implanter according to Embodiment 2 of the present invention, which realizes the method for manufacturing a semiconductor device according to Embodiment 1.

As shown in FIG. 2A, the ion implanter according to Embodiment 2 includes: an ion source 10 that generates ions to be implanted into semiconductor wafers 50 as impurity ions; an extraction accelerator 11 capable of extracting a continuous ion beam 12A from the ion source 10; a beam shield 13 that generates an intermittent pulsed ion beam 12B from the extracted continuous ion beam 12A; a mass spectrometer 14 that discriminates a predetermined ion species from the generated intermittent ion beam 12B; a beam slit 15 that introduces the discriminated ions into the semiconductor wafers 50; and a rotary disk 16 on which a plurality of wafers 50 are placed and which rotates the semiconductor wafers 50 on the face where they are placed. An electron flood gun 17 that generates thermoelectrons for neutralizing the positive charge-up and emits them over the semiconductor wafers 50 is provided between the beam slit 15 and the rotary disk 16.

Figure 2B:
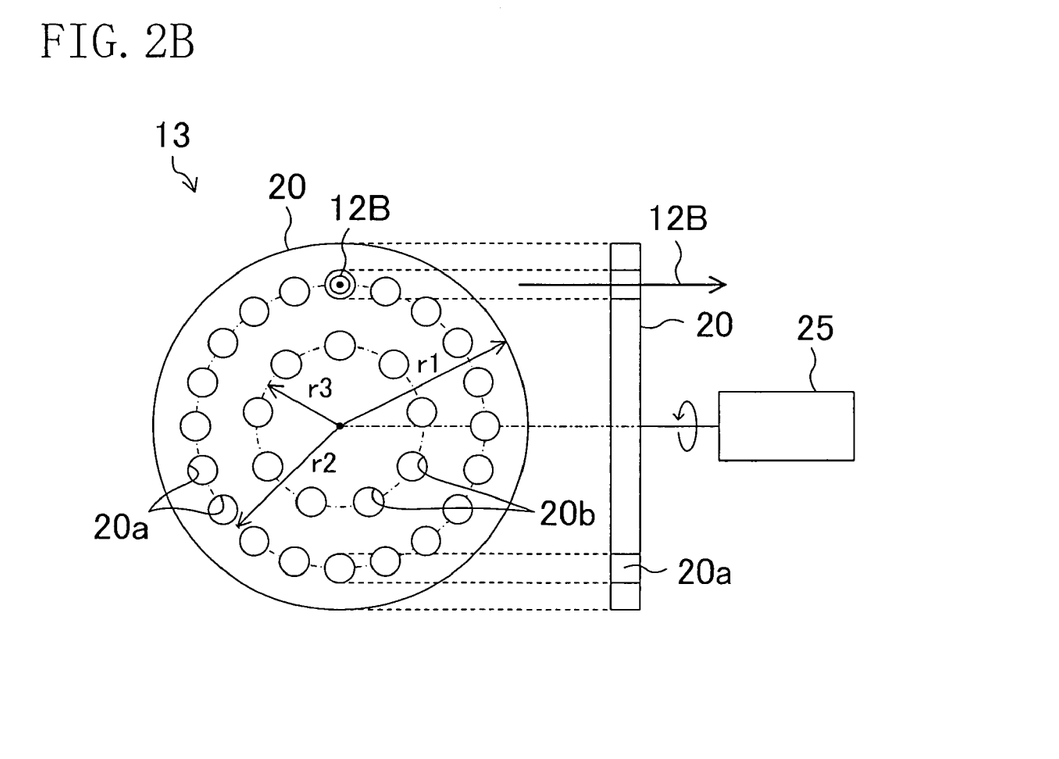
FIG. 2B shows one example of a beam shield in plan and in section of the ion implanter according to Embodiment 2 of the present invention.

FIG. 2B shows one example of the beam shield 13. As shown in FIG. 2B, the beam shield 13 includes a disk 20 made of graphite, for example, and a rotary mechanism 25 of which rotation axis is located at the center of the disk plane of the disk 20.

The disk 20 has a radius r1 of 150 mm, and 20 first openings 20a each having an opening diameter of about 20 mm are formed along a circle of which radius r2 is 127.3 mm from the central axis. Also, 9 second openings 20a each having an opening diameter of about 20 mm are formed along a circule of which radius r3 is 57.3 mm from the central axis.

Suppose that the ratio of the opening diameter of the first openings 20a to intervals between the respective first openings 20a is 1:1, namely the duty ratio is 50%. When the number of rotation is 1000 rpm, the pulse width obtained by the chopping becomes 1.5 ms. This means that the pulse width can be adjusted to be 2 ms or smaller.

Thus, as described in Embodiment 1, the disk 20 is rotated at 652 rpm for attaining the pulse width of 2.3 ms.

Further, in order to change the duty ratio of the openings to the non-opening portion of the disk 20, that is, the duty ratio of the pulse, the ion beam is allowed to pass through the second openings 20b.

It is noted that the disk 20 in plan is not necessarily in the shape of a circle and may be in the shape of an ellipse, a rectangle, a triangle, or in a polygonal shape.

As described above, in Embodiment 2, the mechanical beam shield 13 is provided between the extraction accelerator 11 and the mass spectrometer 14, enabling formation of the intermittent pulsed ion beam 12B. Also, in the case where the disk 20 in which the plurality of openings 20a and the like are formed is used as the beam shielding means, adjustment of the radii r1, r2 of the openings 20a and the like and the number of rotation of the shielding means facilitates generation of the intermittent ion beam 12B having a pulse width of about 1 µm.

As mentioned in Embodiment 1, about 1 ms pulse width is enough, and therefore, an ion implanter including a simple mechanical beam chopping system can be realized without any special construction and any special mechanism added in a case employing such a small pulse width.

Some ion implanters have not only a function of accelerating the ion beam from the ion source 10 by the extraction accelerator 11 but also a function of accelerating it after it passes through the mass spectrometer 14. The use of such an ion implanter makes the construction in which the beam shield 13 is provided between the extraction 11 and the mass spectrometer 14 to be realized easily, as in the present embodiment.

Figure 3:
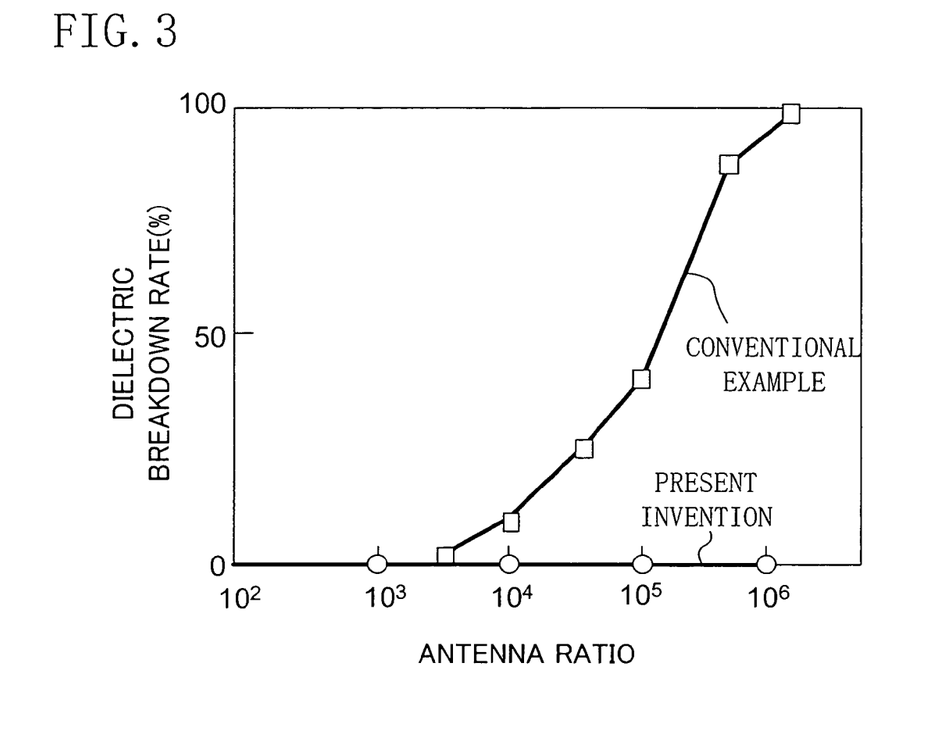
FIG. 3 is a graph showing the relationship between an antenna ratio and a dielectric breakdown rate of a MOS capacitor in the case where ion implantation is performed using the ion implanter according to Embodiment 2 of the present invention, in comparison with a conventional example.

FIG. 3 indicates generally-called dielectric breakdown rates in percentage of an antenna MOS capacitor with antenna ratios from $10^2$ to $10^6$ times in the case where ion implantation under the ion implantation conditions in Embodiment 1 is performed using the ion implanter according to Embodiment 2, in comparison with a conventional example. The ion species was arsenic (As), the implantation energy was set to 20 keV, the dose amount was set to $1\times10^{16}$ /cm$^2$, and the beam current density was set to 3 mA/cm$^2$. The electron flood gun for neutralization was adjusted to allow the electron energy to be 3 eV or lower. Further, a silicon oxide film having a thickness of 2.0 nm was used as the gate insulating film.

Referring to the ion implantation method in the conventional example, a method was employed in which the semiconductor wafer was mechanically scanned in the X-Y direction with the continuous ion beam fixed, wherein the relative line velocity of the beam and the semiconductor wafer was set to 0.8 m/s.

On the other hand, as the ion implantation method in Embodiment 2 of the present invention, a method was employed in which the continuous ion beam 12A was irradiated through the first openings 20a of the disk 20 shown in FIG. 2B as the beam shield 13 with the disk 20 rotated at 750 rpm. This generated the intermittent ion beam 12B having a pulse width of 2 ms, wherein a duty ratio of 50% was obtained. In order that the beam scan part has the same construction as that of the conventional example, the intermittent ion beam 12B was fixed and the semiconductor wafer was mechanically scanned in the X-Y direction at a relative line velocity of the beam and the semiconductor wafer of 0.8 m/s.

As a result, as shown in FIG. 3, the breakdown rate of the insulating film was 0% until the antenna ratio becomes $10^6$ times in the case employing the ion implantation method according to the present invention. Thus, it is understood that the use of the pulsed ion beam according to the present invention suppresses the positive charge-up even if the beam scan mechanism and the scsnning speed are the same as those in the conventional example.

First Modified Example of Embodiment 2

The first modified example of Embodiment 2 will be described below with reference to the drawing.

Figure 4:
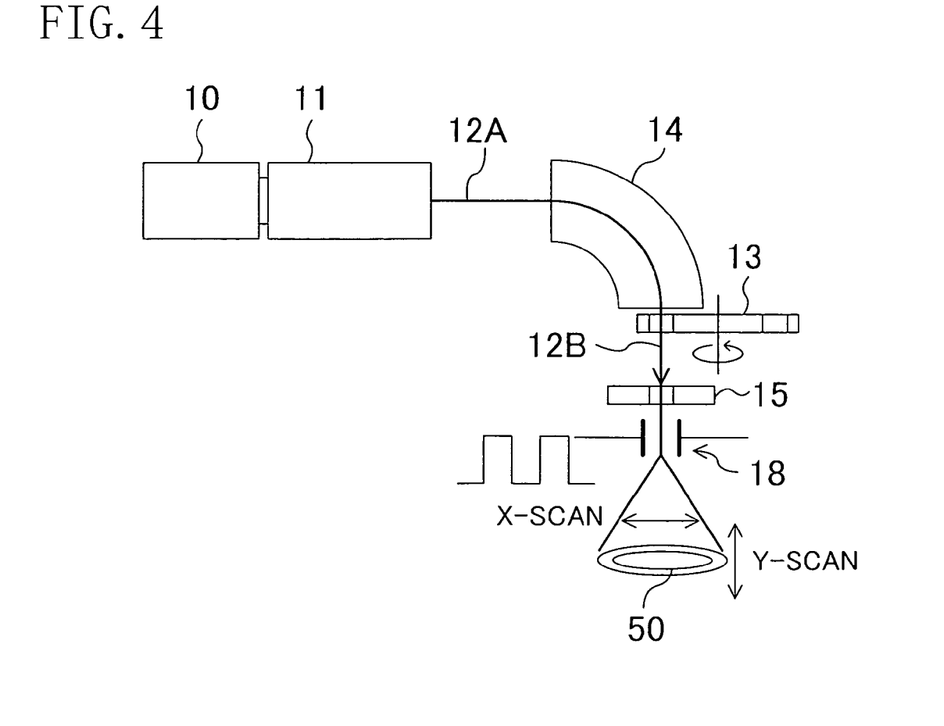
FIG. 4 is a schematic view showing the main part of an ion implanter according to the first modified example of Embodiment 2 in the present invention.

FIG. 4 schematically shows the main part of an ion implanter according to the first modified example of Embodiment 2 of the present invention which realizes the semiconductor device manufacturing method according to Embodiment 1. In FIG. 4, the same reference numerals are assigned to the same constitutional members as those shown in FIG. 2A and the description thereof is omitted.

In the ion implanter according to the first modified example, the beam shield 13 is arranged between the mass spectrometer 14 and the beam slit 15. Further, as a mechanism for irradiating the intermittent pulsed ion beam 12B to the semiconductor wafer 50, an electrostatic scan electrode 18 capable of magnetically changing the advancing direction of the pulsed ion beam 12B is provided between the beam slit 15 and the semiconductor wafer 50, rather than the rotary disk 16 that rotates the plurality of semiconductor wafers 50 placed thereon. In other words, a sheet-fed system is employed where the semiconductor wafer 50 is processed one by one.

The intermittent beam 12B is allowed to perform scan in the X direction at, for example, 200 Hz by the electrostatic scan electrode 18. Further, the semiconductor wafer 50 is scanned in the Y direction at, for example, 10 mm/s.

Second Modified Example of Embodiment 2

Figure 5:
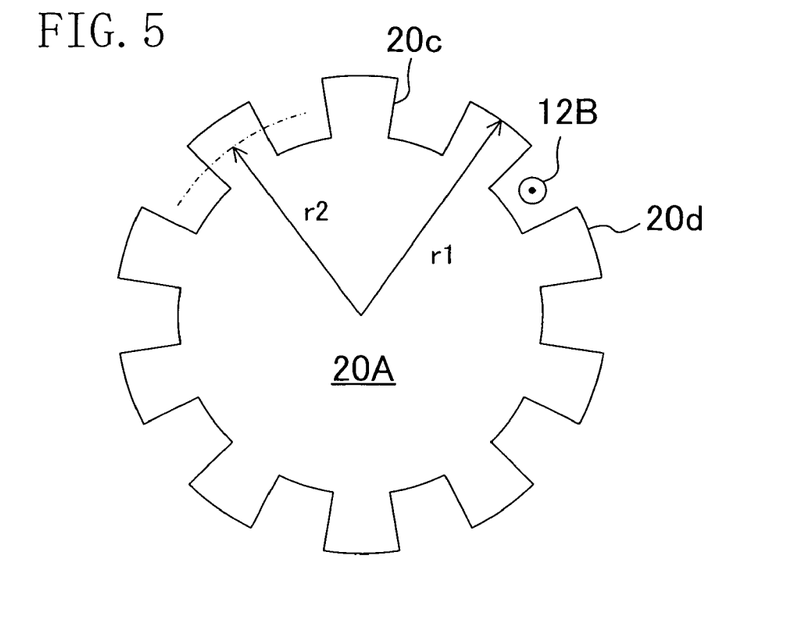
FIG. 5 is a plan view showing one example of a beam shield of an ion implanter according to the second modified example of Embodiment 2 in the present invention.

As shown in FIG. 5, a plurality of notched portions 20c may be formed in the peripheral portion of a disk 20A composing the beam shield 13, instead of the plurality of the openings 20a, 20b, to allow the remaining portion of the disk 20A to serve as rotary blades. In this case, also, adjustment of a radius r1 of the disk 20A, a radius r2 that determines the number and the centers of the notched portions 20c, and the number of rotation of the disk 20A leads to arbitrary determination of the pulse width of the intermittent pulsed beam 12B.

Third Modified Example of Embodiment 2

Figure 6:
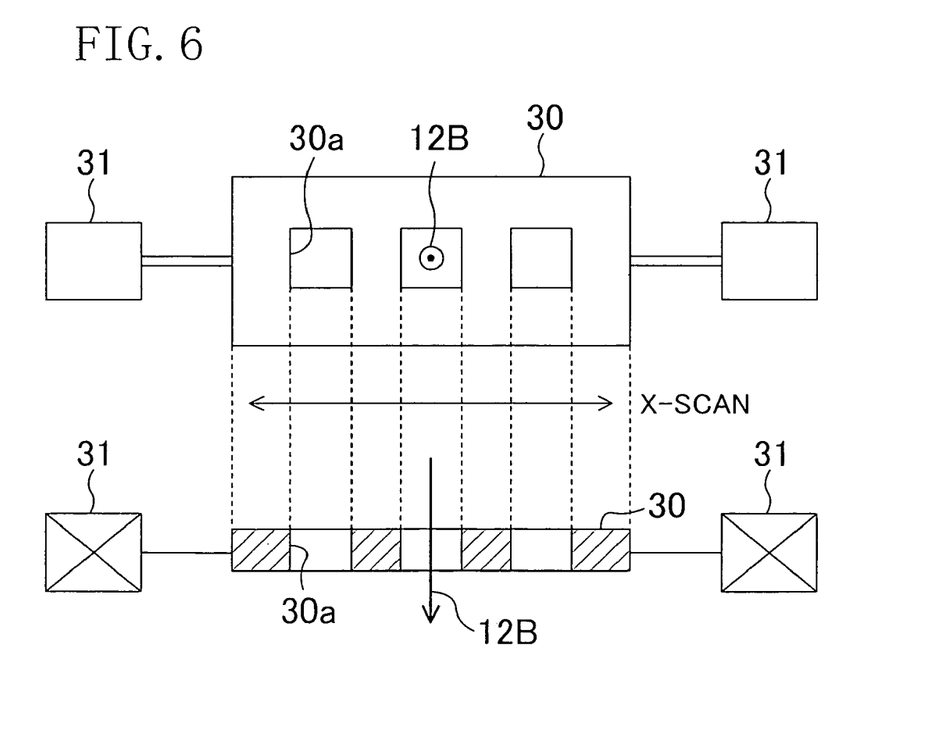
FIG. 6 shows one example of a beam shield in plan and in section of an ion implanter according to the third modified example of Embodiment 2 in the present invention.

As shown in FIG. 6, a slit plate 30 in which a plurality of openings 30a are formed linearly (in a row) may be used instead of the disk 20 composing the beam shield 13.

In the present modified example, three openings 30a are formed in the slit plate 30, and an X-direction slit driving section 31 for allowing the slit plate 30 to be in reciprocating motion in a one-dimensional direction along the line of the openings 30a is provided above the line where the openings 30a are aligned in the slit plate 30. Wherein, each side of each openings 30a is set to 30 mm and the intervals between the respective openings 30a are set to 30 mm.

With the above construction, when the continuous ion beam 12A is chopped by the reciprocating motion in the longitudinal direction of the slit plate 30 within 180 mm distance (amplitude) from the region outside one of the openings 30a to the region outside another opening 30a on the opposite side at 100 Hz, the intermittent pulsed ion beam 12B is formed. The time during which the ion beam is irradiated at this time is about 1 ms if the beam diameter is 20 mm, which amply satisfies the pulse width range of 2.3 ms or smaller indicated in Embodiment 1.

It is noted that the pulse width can be easily changed and the durability of the system increases in the case where the intermittent ion beam 12B is generated from the continuous ion beam 12A by rotating the openings and the non-opening portion in the ion beam shield 13, compared with the case where the intermittent ion bam 12B is generated by reciprocation of the slit plate 30 in a one-dimensional direction.

Embodiment 3

Embodiment 3 of the present invention will be described below with reference to the drawing.

Figure 7:
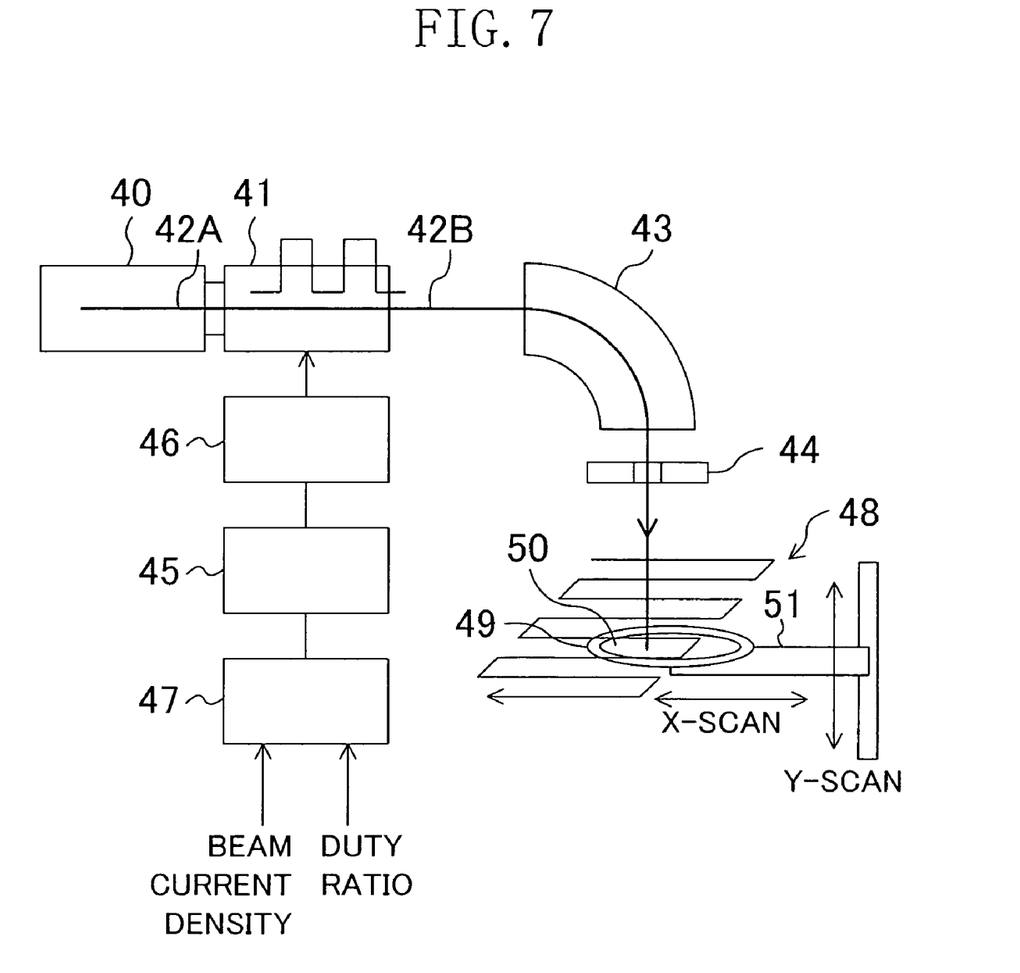
FIG. 7 is a schematic view showing the main part of an ion implanter according to Embodiment 3 of the present invention.

FIG. 7 schematically shows the main part of another ion implanter according to Embodiment 3 of the present invention which realizes the semiconductor device manufacturing method according to Embodiment 1.

As shown in FIG. 7, the ion implanter according to Embodiment 3 includes: an ion source 40 that generates ions to be implanted into the semiconductor wafer 50 as impurity ions; an extraction accelerator 41 that extracts the continuous ion beam 42A generated in the ion source 40 as the intermittent pulsed ion beam 42B; a mass spectrometer 43 that discriminates a predetermined ion species from the extracted intermittent ion beam 42B; and a beam slit 44 that introduces the discriminated ions into the semiconductor wafer 50.

In Embodiment 3, the extraction accelerator 41 itself outputs the intermittent ion beam 42B. In order to do so, there are provided: a variable pulse generator 45 capable of applying a pulse to extraction voltage; a voltage amplifier 46 that amplifies a pulse of the voltage that the variable pulse generator 45 generates and supplies the thus amplified pulsed extraction voltage to the extraction accelerator 41; and a pulse width calculator 47 that calculates in advance a pulse width and a duty ratio, which are programmed according to a beam current density and a duty ratio input from outside, and outputs the calculated result to the variable pulse generator 45.

Further, a beam scan section 48 for scanning the semiconductor wafer 50 is provided on the side of the beam slit 44 where the ion beam advances.

It is noted that no problem is involved even with the additional accelerator provided between the mass spectrometer 43 and the semiconductor wafer 50 because the intermittent ion beam 42B is accelerated only by the pulse.

In Embodiment 3, the beam current is calculated from the dose amount for ion implantation to the semiconductor wafer 50. The calculated ion beam and the relationship indicated in Equation (2), $t \leq 2\epsilon\epsilon_0 \times 10^7/J$, are calculated in the pulse width calculator 47 to determine the pulse width of the intermittent ion beam 42B. Though the duty ratio can be changed arbitrarily, it is set to 50% herein.

Referring to one example, when the pulsed voltage is applied from the voltage amplifier 46 to the extraction accelerator 41 under the conditions that the beam current density is set to 3 mA/cm$^2$, the pulse width is set to 2 ms, and the duty ratio is set to 50%, the intermittent pulsed ion beam 42B can be extracted. Herein, an experiment for ion implantation into the semiconductor wafer 50 was performed under the conditions that arsenic (As) ion was used as an ion species, the acceleration energy was set to 20 keV, and the dose amount was set to $1 \times 10^{16}$/cm$^2$.

Herein, scan by intermittent ion beam 42B was performed in the beam scan section 48 in such a manner that a platen 49 holding the semiconductor wafer 50 was allowed to be in reciprocating motion by an arm 51 in the X direction at a frequency of 2 Hz and at an amplitude of 400 mm while moving in the Y direction at a speed of 10 mm/s with the intermittent ion beam 42B fixed. If the beam diameter of the intermittent ion beam 42B was set to 20 mm at that time, the time during which the ion beam 42B is irradiated was 25 ms.

Under the above conditions, dielectric breakdown of a MOS capacitor having an antennal 10$^6$ times the gate insulating film having a thickness of 2.0 nm was studied to find that the breakdown rate of the gate insulating film was 1% or lower and no charge-up by positive voltage and by negative voltage was observed.

On the other hand, in the case where the ion implantation by the continuous beam into an antenna capacitor was performed under the same conditions as above, the dielectric breakdown rate was 90% or higher and it was confirmed that dielectric breakdown was caused by positive charge-up. From this results, it is understood that the use of the pulsed ion beam remarkably reduces positive charge-up.

As described above, the semiconductor device manufacturing method and the ion implanter used therein according to the present invention can attain independent control of the time period for irradiating an ion beam to a semiconductor wafer by only adjusting a pulse width. Hence, an effect that the positive charge-up can be suppressed in any scan methods and at any scanning speeds of the ion beam can be exhibited, and therefore, the present invention is useful for a semiconductor device manufacturing method, ion implanter, and the like in which ion implantation is performed to a semiconductor device having a capacitor insulating film.

What is claimed is:

1. A semiconductor device manufacturing method comprising the steps of:
    (a) forming an insulating film on a semiconductor region; and
    (b) implanting an impurity ion into the semiconductor region on which the insulating film is formed,
    wherein in the step (b), the impurity ion is implanted into the semiconductor region in a form of a pulsed ion beam for intermittent irradiation,
    the semiconductor region is a semiconductor substrate or a semiconductor layer formed on a semiconductor substrate,
    in the step (b), the ion beam scans the semiconductor substrate in a first direction within a substrate surface thereof while the semiconductor substrate is scanned in a second direction intersecting with the first direction within the substrate surface thereof, and
    in the step (b), the ion beam is implanted so that a pulse width t [s] of the intermittent pulsed beam fulfills:
    t [s]≦(a capacitance per unit area [F/cm$^2$] of the insulating film×2d [cm]×10$^7$ [V/cm])/(an average current density [A/cm$^2$] of the ion beam),
    wherein d[cm] is a film thickness of the insulating film.

2. The semiconductor device manufacturing method of claim 1, wherein the insulating film is a capacitor insulating film.

3. The semiconductor device manufacturing method of claim 1, wherein the insulating film is a gate insulating film.

4. The semiconductor device manufacturing method of claim 1, wherein in the step (b), the ion beam scans electrostatically or electromagnetically.

5. The semiconductor device manufacturing method of claim 1,
    wherein in the stop (b), the ion beam scans the semiconductor substrate two-dimensionally and electrostatically or electromagnetically within a substrate surface thereof.

6. The semiconductor device manufacturing method of claim 1,
    wherein the step (b) includes a step of supplying, from an electron flood gun onto the semiconductor region, electrons for preventing the semiconductor region from being positively electrified by implantation of the ion beam, and
    an energy E [eV] of electrons from the electron flood gun is equal to or smaller than 2d [cm]×10$^7$ [eV/cm] (E≦2d [cm]×10$^7$ [eV/cm]).

7. The semiconductor device manufacturing method of claim 1, wherein a duty ratio of a pulse of the pulsed ion beam is higher than 0 and equal to or lower than 50%.

8. The semiconductor device manufacturing method comprising the steps of:
    (a) forming an insulating film on a semiconductor region; and
    (b) implanting an impurity ion into the semiconductor region on which the insulating film is formed,
    wherein in the step (b), the impurity ion is implanted into the semiconductor region in a form of a pulsed ion beam for intermittent irradiation,
    the semiconductor region is a semiconductor substrate or a semiconductor layer formed on a semiconductor substrate,
    in the step (b), the semiconductor substrate is two-dimensionally scanned within a substrate plane thereof of is scanned while rotating within the plane thereof with the ion beam fixed, and
    in the step (b), the ion beam is implanted so that a pulse width t [s] of the intermittent pulsed beam fulfills:
    t [s]≦(a capacitance per unit area [F/cm$^2$] of the insulating film×2d [cm]×10$^7$ [V/cm])/(an average current density [A/cm$^2$] of the ion beam),
    wherein d [cm] is a film thickness of the insulating film.

9. The semiconductor device manufacturing method of claim 8, wherein the insulating film is a capacitor insulating film.

10. The semiconductor device manufacturing method of claim 8, wherein the insulating film is a gate insulating film.

11. The semiconductor device manufacturing method of claim 8, wherein in the step (b), the ion beam scans electrostatically or electromagnetically.

12. The semiconductor device manufacturing method of claim 8, wherein in the step (b), the ion beam scans the semiconductor substrate two-dimensionally and electrostatically or electromagnetically within a substrate surface thereof.

13. The semiconductor device manufacturing method of claim 8,
wherein the step (b) includes a step of supplying, from an electron flood gun onto the semiconductor region, electrons for preventing the semiconductor region from being positively electrified by implantation of the ion beam, and an energy $E$ [eV] of the electrons from the electron flood gun is equal to or smaller than $2d$ [cm]$\times 10^7$ [eV/cm] ($E \leq 2d$ [cm]$\times 10^7$ [eV/cm].

14. The semiconductor device manufacturing method of claim 8, wherein a duty ratio of a pulse of the pulsed ion beam is higher than 0 and equal to or lower than 50%.

* * * * *

UNITED STATES PATENT AND TRADEMARK OFFICE
CERTIFICATE OF CORRECTION

PATENT NO.         : 7,638,782 B2                                Page 1 of 1
APPLICATION NO.    : 11/204050
DATED              : December 29, 2009
INVENTOR(S)        : Yoneda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1087 days.

Signed and Sealed this

Ninth Day of November, 2010

David J. Kappos
*Director of the United States Patent and Trademark Office*